United States Patent [19]

Anhalt et al.

[11] 3,998,512
[45] Dec. 21, 1976

[54] ELECTRICAL CONNECTOR

[75] Inventors: John W. Anhalt, Orange; David S. Goodman, Mission Viejo; Ocsar Alonso, Westminister, all of Calif.

[73] Assignee: International Telephone and Telegraph Corporation, New York, N.Y.

[22] Filed: Apr. 7, 1976

[21] Appl. No.: 674,501

Related U.S. Application Data

[63] Continuation of Ser. No. 549,774, Dec. 13, 1975, abandoned.

[52] U.S. Cl. ................... 339/17 CF; 339/59 M; 339/DIG. 3
[51] Int. Cl.² ............................................. H05K 1/00
[58] Field of Search .......... 339/17 R, 17 L, 17 LM, 339/17 M, 17 CF, 48, 49, 59–61, DIG. 3; 317/101 C, 101 D, 101 CM

[56] References Cited

UNITED STATES PATENTS

| | | | |
|---|---|---|---|
| 3,430,182 | 2/1969 | Blanche | 339/17 L |
| 3,444,503 | 5/1969 | Mallery | 339/61 |
| 3,509,296 | 4/1970 | Harshman et al. | 339/DIG. 3 |
| 3,638,163 | 1/1972 | Loosme | 339/17 M |
| 3,648,002 | 3/1972 | Du Rocher | 339/DIG. 3 |
| 3,760,330 | 9/1973 | Bennett et al. | 339/17 LM X |
| 3,858,958 | 1/1975 | Davies | 339/17 LM |
| 3,861,135 | 1/1975 | Seeger et al. | 339/DIG. 3 |
| 3,885,173 | 5/1975 | Lee | 339/17 CF X |

*Primary Examiner*—Gerald A. Dost
*Attorney, Agent, or Firm*—Thomas L. Peterson

[57] ABSTRACT

An electrical connector for interconnecting conductive traces on a pair of electronic components, such as a display panel and logic circuit used in a digital wristwatch. The connector comprises an elongated nonconductive elastomeric member having parallel, spaced conductive surfaces thereon which interconnect the traces on the electronic components.

6 Claims, 7 Drawing Figures

3,998,512

ELECTRICAL CONNECTOR

CROSS-REFERENCE TO RELATED APPLICATION

This application is a continuation of our copending application entitled "Electrical Connector", Ser. No. 549,774, filed Feb. 13, 1975.

BACKGROUND OF THE INVENTION

This invention relates generally to an electrical connector and more particularly, to an electrical connector for interconnecting conductive traces on a pair of electronic components.

Electronic systems such as computers and calculators commonly utilize alpha numerical display panels. The more frequently used display panels are the light emitting diode, the liquid crystal display, and the gas discharge types. All of these types of displays utilize a similar method of connecting to the logic circuit in the electronic system. Conductive traces leading from each display are bonded to traces on the logic circuit by means of dots of conductive epoxy. The dots of conductive epoxy are placed on the traces on the logic circuit by hand by the use of a hypodermic needle. The display panel is then placed over the logic circuit with the traces thereon engaging the dots of the conductive epoxy. Needless to say, this technique of electrically connecting the conductive traces on the display panel and logic circuit is very time consuming. Furthermore, this interconnection arrangement provides a somewhat permanent assembly, making it generally impractical for replacement of either the display panel or the logic circuit in the field. As a consequence, the electronic system normally has to be returned to the factory for repair.

With the advent of microdisplays used in miniature computers and digital wristwatches, the problem of interconnecting the display panels to the logic circuits has become acute. The use of conductive epoxy dots to interconnect the traces on the electronic components is frequently impractical since sometimes adjacent dots come into contact causing a short circuit. While electrical connecting devices are available for this application, their sizes are of major design concern particularly in such small devices as digital wristwatches. In addition, such devices frequently damage the conductive traces on the display panel during mating of the electronic components by the connector.

It is known in the art that conductive elastomers may be utilized for performing electrical interconnections, such as for interconnecting an IC to a printed circuit board. The disadvantage of conductive elastomers is high long term compression set which is caused by the massive fillers required to achieve conductivity in the elastomers. Therefore, these conductive elastomer connectors are not entirely suitable for use in interconnecting display panels to logic circuits in miniature devices.

The purpose of the present invention is to overcome the attendant disadvantages of the aforementioned electrical interconnection arrangements by providing a connector which is separable from the electronic components that it is interconnecting, so that it allows replacement of the components in the field, may be made sufficiently small for use in miniature systems, will not cause damage to the traces on the electronic components and is not subject to high long term compression set.

SUMMARY OF THE INVENTION

According to the principal aspect of the present invention, there is provided an electrical connector member for interconnecting rows of conductive traces on a pair of electronic components, such as a display panel and logic circuit utilized in a miniature electronic device like a computer, calculator or digital wristwatch. The connector comprises a generally elongated flat upstanding nonconductive elastomeric member having a vertically extending face thereon and upper and lower edges adjacent to the face. The member is compressible in a vertical direction. A row of vertically extending, spaced conductive surfaces are provided on the face of the member extending from the upper edge to the lower edge thereof. The spacing of these surfaces corresponds to the spacing of the traces on the electronic components. The connector is positioned on a suitable carrier member with the conductive surfaces engaging the traces on the electronic components thereby providing an electrical path between the traces on such components. The connector is simple in construction, inexpensive to manufacture and provides a temporary, rather than a permanent, electrical connection between the electronic components, thereby allowing servicing of the device employing the connector in the field. The connector may be made very small so as to be practically utilized in miniature electronic devices. Moreover, since the elastomeric body of the connector contains no conductive fillers, the connector is not subject to high long-term compression set as are conductor-filled elastomer-type connectors. Other aspects and advantages of the invention will become more apparent from the following description taken in connection with the accompanying drawings.

DESCRIPTION OF THE PREFERRED EMBODIMENTS

Figure 1:
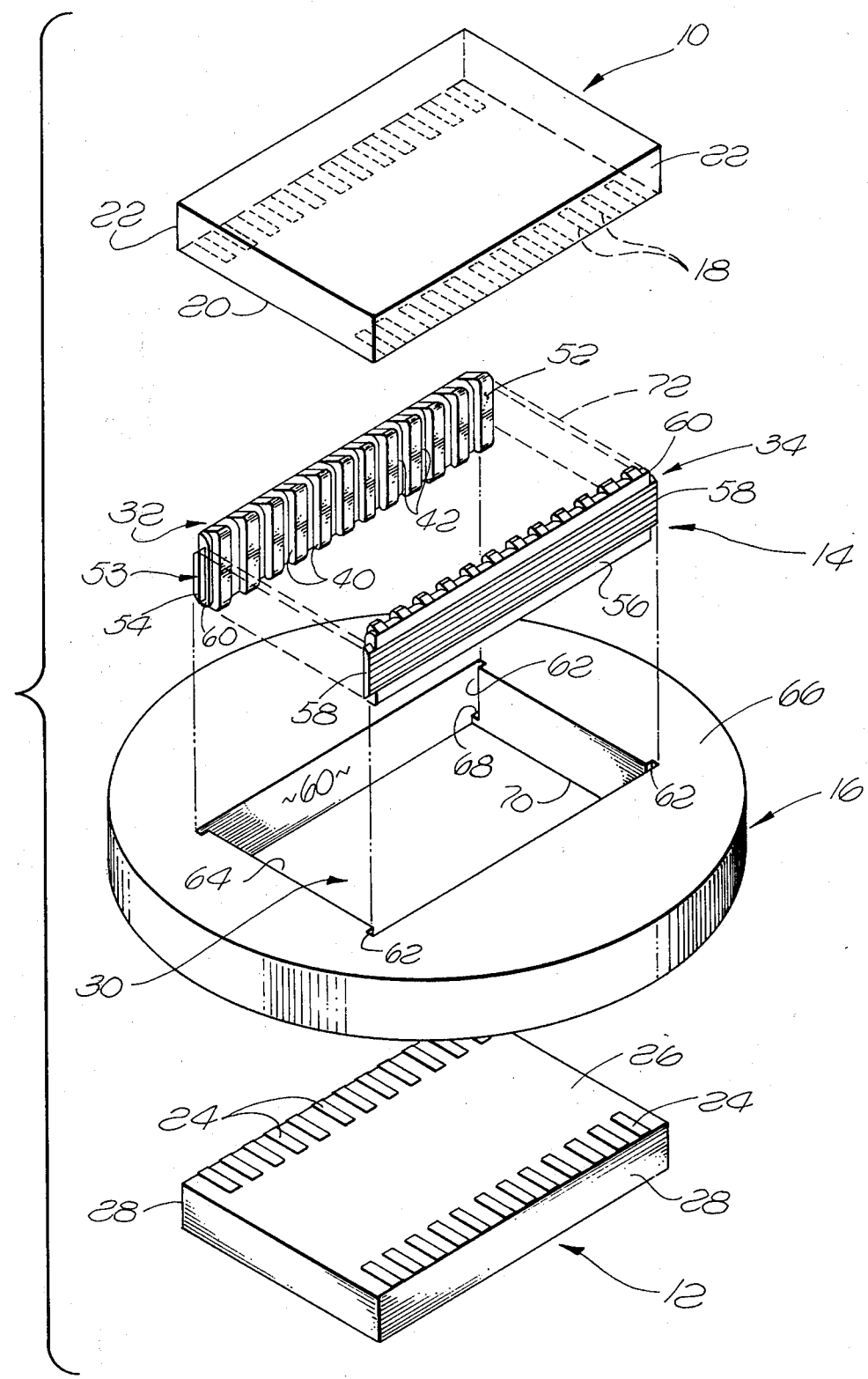
FIG. 1 is an enlarged, perspective exploded view of various parts of an electronic device including a pair of electronic components, a connector constructed in accordance with the present invention for interconnecting the components and a carrier for the connector.

Referring now to FIG. 1 of the drawings in detail, there is illustrated a pair of electronic components 10 and 12, a connector assembly 14 in accordance with the present invention positioned between the components and a carrier 16 in which the connector assembly is mounted. As illustrated, the carrier 16 is a part of a housing of a digital wristwatch. It will be understood, however, that the element 16 may be any part of a miniaturized electronic device, such as a computer or calculator, requiring interconnection between the components 10 and 12. The component 10 may be any form of a display panel such as already mentioned herein. The display panel has two rows of spaced conductive traces 18 on its lower surface 20 adjacent to the sides 22 of the panel. The electronic component 12 is a logic element such as an integrated circuit or chip. It will be appreciated, however, that the logic element could also be a PC board, for example, if the system is a computer or calculator. Two rows of conductive traces 24 are formed on the upper surface 26 of the logic element 12 along the sides 28 thereof. The distance between the rows of traces 18 and 24 is substantially the same, and the individual traces in each row are spaced apart a corresponding distance so that when the display panel 10 is mounted in alignment over the logic element 12, the respective traces on the two components will be in alignment and face each other.

The carrier 16 is shown as having a circular configuration. It will be understood that the carrier could also be square or rectangular if desired depending upon the configuration of the casing in which the various parts illustrated in FIG. 1 are to be mounted. The carrier 16 has a rectangular opening 30 therein in which the connector assembly 14 is mounted in a manner which will be described later.

Figure 2:
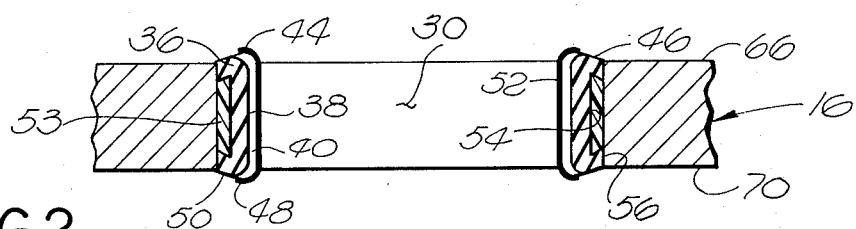
FIG. 2 is a vertical sectional view showing the connector of the present invention mounted in its carrier.

Referring now to FIGS. 1 and 2 in detail, the connector assembly 14 comprises a pair of connector members 32 and 34 which are identical and, therefore, only one connector member 32 will be described herein. The connector member 32 comprises a relatively flat, elongated, upstanding electrically nonconductive elastomeric member 36 which is compressible in the vertical direction. The member 36 may be formed of any suitable elastomeric material, such as polyurethane or silicone rubber, although obviously other elastomers could be used. The only requirement of the elastomeric material is that it is one which exhibits minimum long term compression set, in contrast to conductive elastomers containing fillers required to achieve conductivity. The member 36 has a vertically extending front face 38 on which there are formed a plurality of spaced, raised, vertically extending lands or ribs 40 defining vertical slots 42 therebetween. The lands 40 are spaced apart a distance corresponding to the spacing of the traces 18 and 24 on the electronic components 10 and 12, respectively. It is noted that the upper surfaces 44 of the lands 40 extend a short distance above the upper edge 46 of the elastomeric member 36 while the lower surfaces 48 of the lands extend a short distance below the lower edge 50 of the elastomeric member. The outer surfaces of the lands 40 are coated with a conductive material providing conductive traces or strips 52. These traces extend from the lower surfaces 48 to the upper surfaces 44 of the lands. The conductive coating forming the traces 24 may be a high silver-bearing flexible epoxy. Since the conductive coating is applied only to the raised lands, the traces formed thereby on the lands are electrically isolated from each other by the slots 42.

To increase the columnar strength of the elastomeric element 36, preferably the element is mounted on a relatively rigid plastic support strip 53. The strip 53 has a dovetail configuration in vertical section so as to provide a dovetail interconnection with a suitable shaped recess 54 opening at the rear face 56 of the member 36. The elastomeric member may be mounted on the rigid support strip 53 by merely pressing the member over the strip, causing the strip to become snapped into the recess 54. It is noted that the ends 58 of the support strip extend a short distance beyond the ends 60 of the elastomeric member 36.

The identical connector members 32 and 34 are mounted in the rectangular opening 30 in the carrier 16 with the rear surfaces 56 thereof lying adjacent to the parallel sides 60 of the opening and with the ends 58 of the members slidably fitted into vertical slots 62 formed in the ends 64 of the opening. The slots 62 open at the upper surface 66 of the carrier. It is noted that the bottom 68 of each slot 62 is spaced from the lower surface 70 of the carrier so that the connector members will be supported in the carrier. With the connector members 32 and 34 mounted in this fashion in the carrier 16, the conductive coated lands 40 on the two carrier members will face each other. As seen in FIG. 2, the upper surfaces 44 of the lands extend above the upper surface 66 of the carrier and the lower surfaces 48 of the lands extend below the lower surface 70 of the carrier. Thus, the conductive traces on the lands extending to the upper and lower surfaces 44, 46 are exposed for engagement with the mating traces 18 and 24 on the electronic components 10 and 12, respectively.

Figure 3:
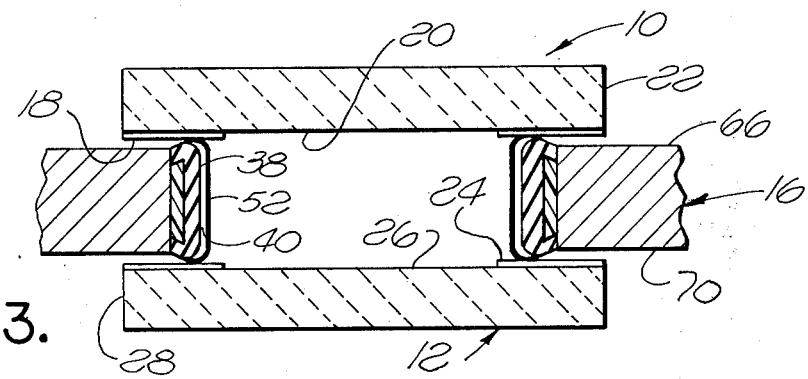
FIG. 3 is a vertical sectional view similar to FIG. 2 but showing the connector interconnecting the traces on the two electronic components illustrated in FIG. 1.

FIG. 3 illustrates how the connector members 32 and 34 provide electrical connection between the traces 18 and 24 when the connector assembly 14 is sandwiched between the components 10 and 12. Normally there will be a slight vertical compressive force on the assembly illustrated in FIG. 3, by its mounting in the watch casing, not shown, so that the upper and lower surfaces of the lands are slightly compressed vertically. Hence, there is a resilient electrical interconnection between the traces 52 on the lands of the connector members and the traces of the electronic components 10 and 12.

While the connector members 32 and 34 have been described as being separate parts, it will be appreciated that they may be interconnected at their ends 58 by parallel sidewalls 72, shown in dotted lines in FIG. 1, providing an integral rectangular frame-like connector assembly which may be mounted as a unit within the opening 30 in the carrier 16. It will also be appreciated that if the electronic components 10 and 12 have only a single row of traces thereon, then only one connector member 32 and 34 would be required for providing electrical interconnection therebetween.

It is seen that the connector of the present invention has the advantage over conductive-filled elastomers in that the elastomeric member 36 is not filled and acts only as a spring member, which urges and maintains the conductive traces 52 in electrical engagement with the traces on the electrical components 10 and 12. The elastomer is not subject to high long term compression set resulting in loss of electrical contact as sometimes occurs with filled-conductive elastomers. In addition, the connector member 32 is very thin and takes up only a very small amount of space in the assembly in which it is utilized. Obviously, the time for mounting the connector in the carrier 16 to electrically interconnect the components 10 and 12 is many times less than that required to interconnect the components by the use of dots of conductive epoxy using a hypodermic needle as is the conventional practice now. Therefore, the connector of the present invention is much less expensive to utilize. In addition, it has the advantage that it does not provide a permanent assembly requiring return of the system to the factory for repair. The connector members 32 and 34 have only a contact engagement with the traces on the components 10 and 12, and are readily removed from the carrier 16 allowing either one of the electronic components to be replaced in the field as required. Likewise, either of the connector members may be replaced if damaged.

Figure 4:
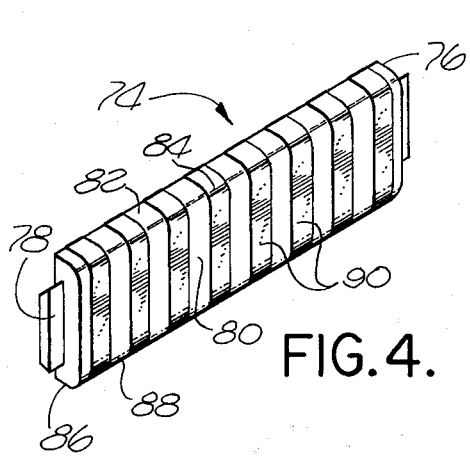
FIG. 4 is an enlarged, perspective view of a modified form of a connector of the present invention.

Reference is now made to FIG. 4, which illustrates a modified form of the connector member of the present invention, generally designated 74. The connector member 74 is similar to the members 32 and 34 in that it comprises a flat elongated upstanding nonconductive elastomeric member 76 which may be mounted on a support strip 78 similar to the strip 53. The elastomeric member 76 has a vertical front face 80. The upper edge 82 of the member 76 is joined to the front face 80 by an upper curved surface 84 while the lower edge 86 of member 76 is joined to the face 80 by a lower curved surface 88. Vertically extending spaced conductive traces or strips 90 are formed on the front face 80 of the elastomeric member 76 and extend from the upper edge 82 to the lower edge 86 thereof. Thus, this embodiment of the invention differs from that illustrated in FIGS. 1–3 in that it does not include the raised lands on which the conductive traces are coated. While the elastomeric member 76 is somewhat less expensive to form than the member 36 having the lands 40 thereon, masking techniques must be utilized to form the traces 90 on the elastomeric member in order to avoid short circuits therebetween. In contrast, in the embodiment of the invention illustrated in FIGS. 1–3, the conductive traces 52 are easily formed on the lands 40 by simply passing a roller carrying the conductive coating material over the lands. No masking is required in the first embodiment. Otherwise, the embodiment in FIG. 4 functions in substantially the same manner, with the same advantages as the first embodiment of the invention.

Figure 5:
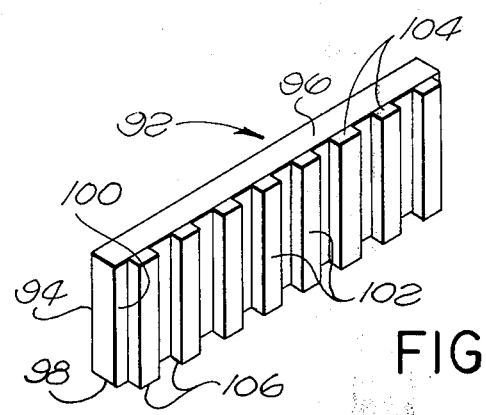
FIG. 5 is an enlarged, perspective view of a further form of the connector.
Figure 6:
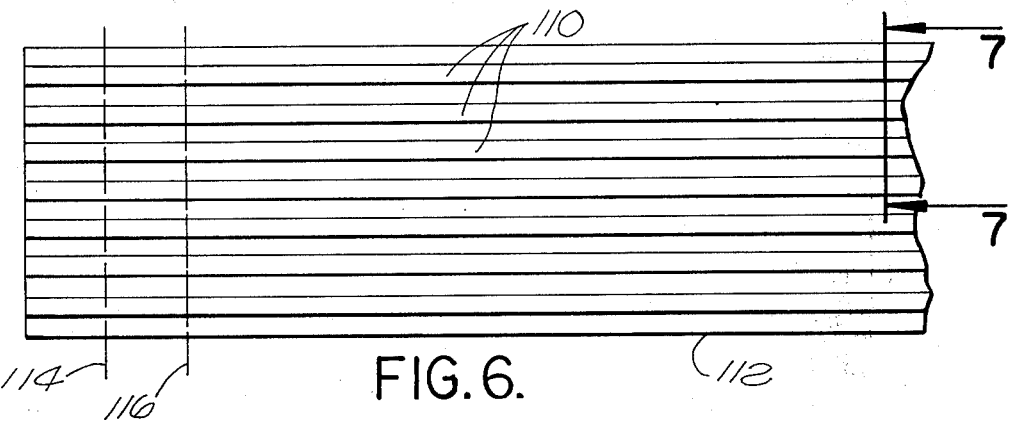
FIG. 6 is a top plan view of an elastomeric strip used in the manufacture of the connector illustrated in FIG. 5.
Figure 7:
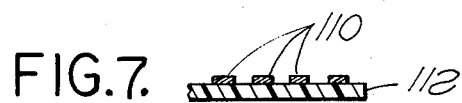
FIG. 7 is a section view taken along 7—7 of FIG. 6.

Referring now to FIG. 5, there is shown a further form of the connector member of the invention, generally designated 92. This connector comprises a flat, elongated nonconductive elastomeric member 94 having a flat upper edge 96, a flat lower edge 98, and a flat front face 100. A row of vertically extending, parallel spaced strips 102 are joined to the face 100 of member 94 and extend from the upper edge 96 to the lower edge 98 thereof. The upper end 104 of each strip 102 is flush with the upper edge 96 of member 94 and the lower end 106 of each strip is flush with the lower edge 98. Unlike the conductive strips 52 and 90 which are conductive coatings, the strips 102 are formed of a conductor-filled elastomer. Preferably the member 94 is formed of nonconductive silicone rubber and the strips 102 are formed of silicone rubber containing sufficient conductive filler, such as carbon or silver particles, to be electrically conductive. Member 94 could be mounted on a rigid supporting strip, like strip 53, if desired. In some applications, it is desired to bend the connector and in those cases the supporting strip is eliminated, as in FIG. 5.

The connector member 92 may be formed by joining a plurality of conductor-filled silicone rubber strips 110 to the face of an elongated nonconductive silicone sheet 112 having a width corresponding to the desired length of the connector to be produced. The strips 110 are mounted in parallel, spaced relation on the sheet 112. The strips may be provided on the sheet by dual color molding techniques, which are well known in the rubber molding art. Alternatively, the strips could be applied to the sheet by a suitable cement or by heat bonding. The sheet 112 is then cut transversely to predetermined lengths, such as indicated by dotted lines 114, 116 to provide a plurality of connector members 92. The length of the cut segments from the sheet is determined by the height desired for the connector member 92. It will be appreciated that this method is very simple and inexpensive, and permits very small connectors to be produced. For example, by this method, a connector as shown in FIG. 5 can be produced which is only about ¼ inch long and 3/16 of an inch high. As in the other embodiments, the connector 92 does not suffer from high long term compression set since the body of the connector is formed of an elastomer that contains no conductive fillers.

What is claimed is:

1. An electrical connector member for interconnecting a first electronic component having a first row of spaced conductive traces on the lower surface thereof with a second electronic component having a second row of spaced conductive traces on the upper surface thereof aligned with said first row of conductive traces comprising:
   an electrically nonconductive resilient elastomeric member having front and rear generally flat vertically extending faces thereon, said member being compressible in a vertical direction;
   said member having upper and lower edges;
   a row of vertically extending spaced electrically conductive resilient elastomeric strips adhered to only said front face and extending from said upper edge to said lower edge, the spacing of said strips corresponding to the spacing of said traces on said electronic components, said upper and lower edges and said rear face being devoid of any conductive material thereon;
   said upper and lower edges being generally flat and parallel to each other; and
   the upper and lower ends of said strips being coplanar with said upper and lower edges, respectively.

2. A method of making an electrical connector comprising the steps of:
   joining a plurality of elongated, parallel, spaced electrically conductive resilient elastomeric strips to the flat face of an electrically nonconductive elongated resilient elastomeric member with said strips extending lengthwise of said member; and
   cutting said member transversely to predetermined lengths to provide a plurality of said connectors.

3. A method as set forth in claim 2 wherein:
   said member is cut so that said lengths are shorter than the width of said member.

4. A method as set forth in claim 2 wherein:
   said strips are joined to only one face of said member.

5. A method of making an electrical connector comprising the steps of:
   positioning a plurality of elongated, parallel, spaced electrically conductive resilient elastomeric strips lengthwise on the flat face of an electrically nonconductive elongated resilient elastomeric member;
   adhering said strips to said member; and
   cutting said member transversely to predetermined lengths to provide a plurality of said connectors.

6. A method of making an electrical connector comprising the steps of:
   molding a plurality of elongated, parallel, spaced electrically conductive resilient elastomeric strips lengthwise onto the flat face of an electrically nonconductive resilient elastomeric member whereby said strips are adhered to said member; and
   cutting said member transversely to predetermined lengths to provide a plurality of said connectors.

* * * * *